(12) United States Patent
Gossner et al.

(10) Patent No.: US 10,082,534 B2
(45) Date of Patent: Sep. 25, 2018

(54) DIRECTIONAL PULSE INJECTION INTO A MICROELECTRONIC SYSTEM FOR ELECTROSTATIC TEST

(71) Applicant: Intel IP Corporation, Santa Clara, CA (US)

(72) Inventors: Harald Gossner, Riemerling (DE); Krzysztof Domanski, Munich (DE); David Johnsson, Munich (DE); Benjamin J. Orr, Rolla, MO (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/029,066

(22) PCT Filed: Jun. 17, 2015

(86) PCT No.: PCT/US2015/036265
§ 371 (c)(1),
(2) Date: Apr. 13, 2016

(87) PCT Pub. No.: WO2016/204749
PCT Pub. Date: Dec. 22, 2016

(65) Prior Publication Data
US 2017/0168110 A1   Jun. 15, 2017

(51) Int. Cl.
*G01R 31/28* (2006.01)
*G01R 31/304* (2006.01)
(Continued)

(52) U.S. Cl.
CPC .......... *G01R 31/281* (2013.01); *G01R 31/14* (2013.01); *G01R 31/2851* (2013.01)

(58) Field of Classification Search
CPC .. G01R 31/281; G01R 31/14; G01R 31/2851; G01R 31/2827; G01R 31/001; G01R 31/002
(Continued)

(56) References Cited

U.S. PATENT DOCUMENTS 3,510,690 A * 5/1970 Kawabata .............. H03K 3/315
                                                      327/195
5,519,327 A * 5/1996 Consiglio ............ G01R 31/002
                                                      324/602
(Continued)

FOREIGN PATENT DOCUMENTS

| WO | WO2005/121821 A1 | 12/2005 | |
|----|------------------|---------|----|
| WO | WO 2005121821 A1 * | 12/2005 | ......... G01R 31/1227 |
| WO | WO 2016204749 A1 * | 12/2016 | ............. G01R 31/12 |

OTHER PUBLICATIONS

PCT International Search Report with attached Written Opinion of the International Searching Authority for International Application No. PCT/US2015/036265, dated Mar. 17, 2016, 13 pages.
(Continued)

*Primary Examiner* — Jermele M Hollington
*Assistant Examiner* — Sean Curtis
(74) *Attorney, Agent, or Firm* — Schwabe, Williamson & Wyatt, P.C.

(57) ABSTRACT

A directional pulse injection system and method are described for injecting a pulse into a microelectronic system for electrostatic test. One example has a transformer coupled to a pulse source through a transmission line and to a conductive trace of a test board to apply the electrical pulse to the trace as a test pulse. The test board is connected to a microelectronic device under test. This example also has a cancellation pulse transmission line coupled to the pulse source and a cancellation pulse contact coupled to the pulse source through the cancellation pulse transmission line and
(Continued)

to the trace on a side of the trace opposite the transformer to receive a cancellation signal from the pulse source and to couple the cancellation signal to the trace to cancel a portion of the test pulse.

20 Claims, 6 Drawing Sheets

(51) Int. Cl.
  *G01R 31/306* (2006.01)
  *G01R 31/309* (2006.01)
  *G01R 31/14* (2006.01)

(58) Field of Classification Search
  USPC .......................................... 324/763.01, 456
  See application file for complete search history.

(56) References Cited

U.S. PATENT DOCUMENTS

| | | | | |
|---|---|---|---|---|
| 5,804,977 A * | 9/1998 | Consiglio | ............ | G01R 31/002 324/676 |
| 6,429,674 B1 * | 8/2002 | Barth | ................... | G01R 31/001 324/676 |
| 7,274,545 B2 * | 9/2007 | Marum | ................... | H02H 9/046 361/56 |
| 7,545,152 B2 * | 6/2009 | Grund | ................... | G01R 27/04 324/601 |
| 7,560,948 B2 * | 7/2009 | Grund | ................... | G01R 31/002 324/452 |
| 7,830,040 B2 * | 11/2010 | McDonald | ........... | H02N 11/004 307/106 |
| 8,278,936 B2 * | 10/2012 | Grund | ................... | G01R 31/002 324/537 |
| 8,594,957 B2 * | 11/2013 | Gauthier | ............. | G01R 31/002 324/458 |
| 9,213,048 B2 * | 12/2015 | Mertens | ................... | G01R 1/18 |
| 9,274,155 B2 * | 3/2016 | Chang | ................... | G01R 31/002 |
| 9,377,496 B2 * | 6/2016 | Chang | ................... | G01R 31/002 |
| 9,671,448 B2 * | 6/2017 | Nelsen | ................... | G01R 31/002 |
| 9,684,029 B2 * | 6/2017 | Chang | ................... | G01R 31/2839 |
| 9,726,707 B1 * | 8/2017 | Barth | ...................... | G01R 31/12 |
| 2007/0165344 A1 * | 7/2007 | Esmark | ............... | G06F 17/5036 361/56 |
| 2007/0216432 A1 * | 9/2007 | Kister | ................. | G01R 1/07378 324/754.11 |
| 2008/0315891 A1 * | 12/2008 | Grund | ................... | G01R 31/2837 324/534 |
| 2009/0134880 A1 * | 5/2009 | Grund | ................... | G01R 31/002 324/537 |
| 2012/0017428 A1 * | 1/2012 | Hsu | ..................... | G01R 1/07378 29/602.1 |
| 2013/0176140 A1 * | 7/2013 | Tyshko | ................... | G01V 3/32 340/854.6 |
| 2013/0214616 A1 * | 8/2013 | Farbiz | ................... | G01R 31/001 307/113 |
| 2013/0328581 A1 * | 12/2013 | Lee | ................... | G01R 31/31924 324/750.01 |
| 2014/0021963 A1 * | 1/2014 | Cole | ....................... | G01R 31/11 324/537 |
| 2014/0035608 A1 * | 2/2014 | Mertens | ................... | G01R 1/18 324/754.03 |
| 2014/0084950 A1 * | 3/2014 | Chang | ................... | G01R 31/002 324/750.01 |
| 2014/0184253 A1 * | 7/2014 | Nelsen | ................... | G01R 31/002 324/750.02 |
| 2014/0333339 A1 * | 11/2014 | Orr | ...................... | G01R 31/002 324/756.02 |
| 2015/0097118 A1 * | 4/2015 | Zheng | ....................... | G01J 3/42 250/339.07 |
| 2016/0018452 A1 * | 1/2016 | Chang | ................... | G01R 31/002 324/750.01 |
| 2016/0097804 A1 * | 4/2016 | Chang | ................... | G01R 31/2839 324/750.01 |
| 2017/0168110 A1 * | 6/2017 | Gossner | ............... | G01R 31/281 |

OTHER PUBLICATIONS

International Preliminary Report on Patentability for PCT/US2015/036265, dated Dec. 19, 2017, 10 pages.

* cited by examiner

DIRECTIONAL PULSE INJECTION INTO A MICROELECTRONIC SYSTEM FOR ELECTROSTATIC TEST

CROSS-REFERENCE TO RELATED APPLICATION

This patent application is a U.S. National Phase Application under 35 U.S.C. § 371 of International Application No. PCT/US2015/036265, filed Jun. 17, 2015, entitled DIRECTIONAL PULSE INJECTION INTO A MICROELECTRONIC SYSTEM FOR ELECTROSTATIC TEST.

FIELD

The present description relates to injecting a pulse into a part of microelectronic system to perform an electrostatic discharge test and, in particular to injecting a pulse with a selected direction.

BACKGROUND

An integrated circuit is susceptible to an electrostatic discharge (ESD). A sudden discharge from some external device or phenomenon can cause a failure in the integrated circuit (IC). The risk is particularly high for devices that are not grounded such as portable and handheld devices. The ability of a device to survive an ESD may be increased by protecting certain components (component-level ESD protection) and by protecting the overall system (system-level ESD protection). The system level ESD protection may consider the behavior of an electronic device including external pins, pins being directly accessible, and also internal integrated components or pins, since a damaging current pulse may reach an ESD sensitive region or pin within the electronic device. To find and resolve ESD failures, testing is used to make a more robust component or system design and to understand and consider the effects of ESD failures. Manufacturing and development may be adjusted using the results.

ESD tests are a part of electronic system qualification. In order to pass these tests, electronic systems are tested repeatedly to try and determine the source of ESD failures. Much of the current remedies to failures are applied using iterative trial and error steps because it is difficult to determine the exact failure mechanism and the stress path in the system. Many of the test failures are so-called soft failures in which the system enters an invalid state after an ESD stress. The invalid state will require the user to power down and restart the system in most cases. This is a time consuming process when trying to stress a system during test. Discovering and fixing ESD problems especially those that cause a soft failure in an empirical manner is time consuming and odd costs even to the extent of delaying product launches.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

As described herein each single pin of an IC may be tested for hard and soft failures while the IC is in operation. A TLP (Transmission Line Pulse) may be applied directionally into a specific pin under investigation while the system is working on a system board and while signals are transmitted on the tested line of the motherboard between a transmitter component and a receiver component. As described herein stress pulses or test pulses may be injected directly onto a transmitting signal line or transmission line. The stress pulse only stresses a selected pin of the line without interfering with any high speed signaling on the line. The stress pulse tests conditions at that pin and on that transmission line to help isolate possible faults or failures.

As described herein, the stress pulse may be applied by inductively coupling the pulse through a transformer into the signal line. The inductively coupled pulse generates a bipolar pulse travelling in both directions on the signal line. One direction is the wanted pulse to the selected pin of the IC under test. The other direction is in an unwanted direction. The unwanted signal may flow to different ends of the signal line and affect many different components. This interferes with the intended test because the effect of the pulse is not isolated to the selected pin. The pulse into the unwanted direction may then be eliminated by injecting a compensation pulse onto the signal line. As described herein, the pulse in the unwanted direction may be reduced by a factor of 100-1000 or more.

The techniques described herein may be used for soft fail analysis and a variety of other tests and provide much more useful results because the pulse may be isolated. As described herein, a magnetically coupled device provides a polar disturbance on a net or wire to inject a directional current into a system. In some embodiments, a perfect voltage source is placed in series with the net under test (NUT). The series impedance added to the NUT by a perfect voltage source is very low compared to a current source. This provides a better injection and a better compensation of the unwanted signal. The NUT is typically a system board or another spacer or interposer board that has lines or traces to provide access to particular pins of the IC that is to be tested.

Figure 1:
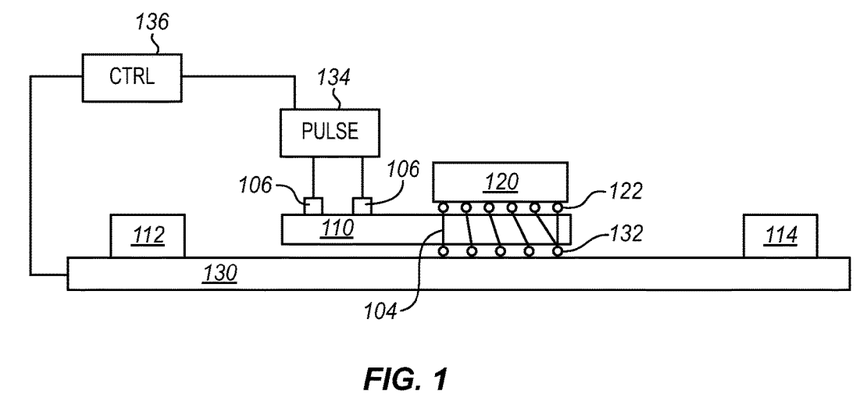
FIG. 1 is a side view diagram of an example testing configuration according to an embodiment.

FIG. 1 is a side view diagram of an example of a testing configuration suitable use with the pulse injection techniques as described herein. A test board 130, such as a system verification board, system board, motherboard, or logic board 130 is coupled to test controller 136. The test controller may be in the form of a computer workstation with appropriate adapter cards or in other forms. A variety of different components 112, 114 are coupled to the system board, such as power supply, input/output, processing, passive electrical, radio, sensor, and other types of components. Only two are shown in order to simplify the drawing. An integrated circuit 120 to be tested also referred to as the DUT (Device Under Test) is connected to the test board through a fan-out board 110. The DUT may be a bare die or packaged die of any type. If the DUT is a package then it may contain one or more dies. The DUT may also be socketed (socket not shown).

There may be other intermediate interposers, spacers, and other boards between the DUT and the test board. There may be additional components connected to the fan-out board and additional fan-out boards for other components. Alternatively, the function of the fan-out board may be integrated into the test board, so that the fan-out board is not used.

The test board may be an actual production system board for the end product or it may be a board that is specifically designed for test purposes. The test board performs some or all of the functions of the production system board and connects the DUT to other components. By using a production prototype board as the test board, the ESD characteristics of the production board may also be measured. In addition, any contribution of the test board to any failure may be isolated. Using a production prototype board also allows the DUT to be operated in a manner similar to normal operations. The test controller 136 drives signals and power on the test board to simulate normal operation and also to simulate high stress test conditions of the device under test. A discrete power supply system may be used or the power supply system may be incorporated into the test controller. There may be many more test boards coupled to the test controller.

The DUT has an array of integrated circuit contact pads 122, such as a ball grid array, a land grid array, a pin grid array, or any other type of contact pads or pins. These connect to corresponding contact pad, pins, or balls on the fan-out board 110. The fan-out board has a plurality of fan-out contact pads 106 which are used as test pads for injecting a TLP. There may also be probe contact pads and other connectors for other purposes. As shown these are on the same side of the fan-out board as the DUT to allow for easy access from above the test board. As mentioned above, the fan-out contact pads may alternatively be incorporated on the test board so that no fan-out board is used. The fan-out contact pads provide a signal line that connects to a particular pin of the DUT. The test board may have additional test contact pads for testing the DUT, probing signals of the DUT or for other purposes and other components.

The fan-out board also has an array of vias 104, redistribution layers, fan-out layers or other structures to couple the DUT 120 to the test board 130 through the fan-out board. The fan-out board also has a contact array 132, such as a solder ball or pin array to connect to the test board. If the test board is a production board or has a production contact array for the DUT, then the fan-out board contact array emulates the configuration of the DUT. The vias and bottom contacts allow the fan-out contacts to connect indirectly to the test board as well as to the DUT.

The test contacts 106 of the fan-out board or the test board or both are configured to allow a voltage or a current provided by a pulse source 134 to be applied to one or more pins or contact pads of the DUT 120. The pulse source may provide a variety of different voltage and current levels and different durations and pulse shapes to any particular pin of the DUT using the fan-out board contacts or other suitable contacts. The injected pulse may be high current (e.g. larger than about 1 A, 10 A, or 20 A) within a short time (e.g. smaller than about 10 ms, 1 ms, 100 ns, 10 ns, or 1 ns) into the integrated circuit 220. At the same time, the same or another contact may be used for a probe contact to allow the activity of the DUT, including any responses to the pulse, to be monitored. The responses may be coupled through the test board or the probe contact to the test controller or to another device to determine measure the response of the DUT, if any, to the pulse.

Figure 2:
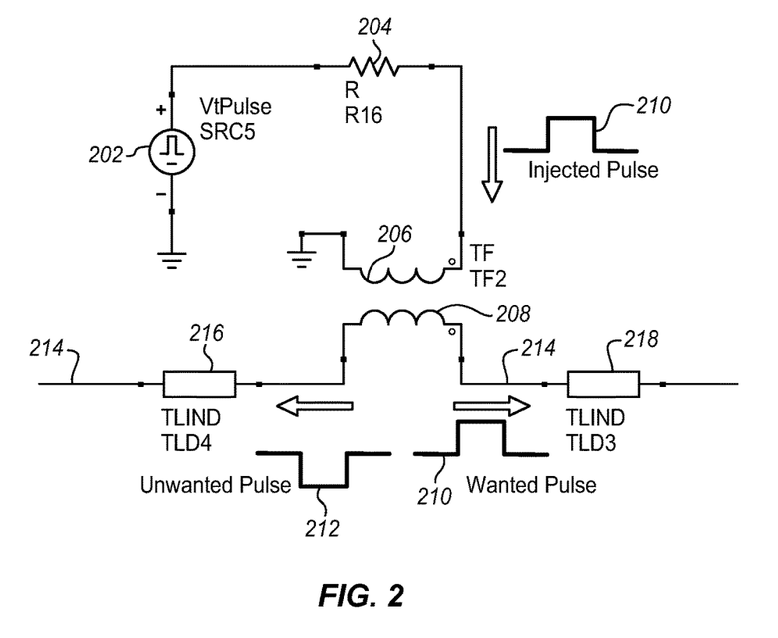
FIG. 2 is a diagram of circuit for injecting a pulse onto a contact pad according to an embodiment.

FIG. 2 is a diagram of a circuit for injecting a pulse onto a contact pad 106 or test board trace for ESD test. A pulse 210 is generated by a switched voltage source 202. The generated voltage pulse is supplied to a primary winding a transformer 206 through a load 204. The primary winding is coupled to a secondary winding 208 that is coupled to or is a part of the contact pad or test board trace 214. The secondary winding may be directly connected to the trace by being part of the test board or another board, such as a fan-out board or interposer coupled to the test board or to an actual production system board. Alternatively, it may be connected temporarily using pogo pins or another type of temporary connector. The pulse applied to such a transmission line 214 may be referred to as a transmission line pulse (TLP). The transmission line has an inherent impedance 216 in both directions that interacts with the secondary winding to affect the propagation characteristics of the TLP.

To create the desired voltage source on a pin or pad of the DUT, the secondary winding of the transformer is placed in series with the NUT (Network Under Test). The NUT is typically the test board but may instead be a fan-out board, interposers, or any other connection device. The transformer has a turns ratio such that the impedance of the pulse source will be reflected across the device as some smaller impedance by the square of the turns ratio. This creates a series voltage source with a relatively small impedance that is suitable for use even in high-speed nets which require impedance matched drivers and receivers. By injecting a single-ended pulse into the primary winding of the transformer to GND (Ground), a potential is induced across the secondary side of the transformer, causing a directional disturbance in the line.

The approach shown in FIG. 2, without more provides a low impedance directional injection. However, it induces both a positive disturbance 210 towards one side of the NUT and a negative disturbance 212 in the opposite direction on the secondary winding toward the other side of the NUT. The directionality of the two TLPs is indicated by the arrows next to each pulse. The polarity of the pulse is indicated by the pulse shape on either side of the secondary winding 208. Upon injecting the pulse through the primary windings, a reverse polarity pulse occurs at the secondary windings of the transformer in the opposite direction.

As a result of this effect of the secondary windings, the current will be injected into two points on the NUT or on the integrated circuit that is being tested. In order to isolate a specific device, pad, or pin from others to which it is also connected, one direction of the pulse may be removed. To study the effects of a current injected into that specific device, one of the pulses may be canceled out. This prevents the other direction from injecting a disturbance into another part of the system.

Figure 3:
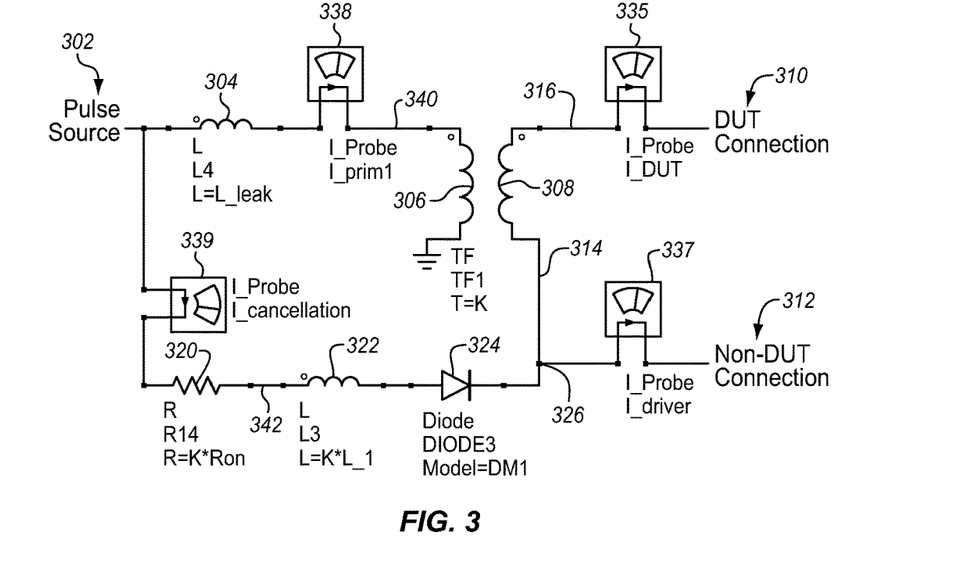
FIG. 3 is diagram of a system for injection a test pulse and a cancellation pulse onto a test board according to an embodiment.

The cancellation may be performed, as described herein, by injecting an opposite positive pulse directly into an appropriate location on the NUT. The positive pulse cancels the unwanted negative going pulse. An example of a system that includes a cancellation circuit is shown in FIG. 3 which is a circuit diagram of a pulse injection system suitable for applying transmission line pulses to a NUT for test purposes.

The unidirectional transmission line pulse injection system has a switched power supply 302 to generate a pulse. The pulse source may be a transmission line pulser or a solid state pulser or any of a variety of different switched power supplies, depending on the particular implementation.

The pulse is applied through a test pulse transmission line 340 having a leakage inductance 304 to a primary winding 306 of an inductor as a test pulse for the DUT. A secondary winding 308 of the inductor is coupled to a trace 314 on a NUT. The inductor generates a low-impedance pulse that propagates bi-directionally on the trace to simulate an ESD. While a genuine ESD will propagate in multiple directions, this pulse is being used to isolate faults and weak points on the board and so the pulse is isolated to a single connection. In one direction a wanted part of the pulse connects to a DUT connection 310 which represents the pad or pin of a microelectronic device or a portion of a system board that is to be tested. In the other direction, the pulse travels toward another connection 312 that is not to be tested. There may be more than one connection, depending on the configuration of the NUT. The connection may be to the same or another microelectronic device on a different pin or pad, or it may be to another device or another part of the system board.

The system also has a cancellation side to diminish the part of the pulse that is propagating in the unwanted direction toward the connection 312 that is not to be tested. The same pulse from the pulse source 302 is also coupled through a cancellation pulse transmission line 342 having series resistor 320, an inductor 322, and a decoupling diode 324 to a connection 326 on a different location on the NUT. The cancellation pulse is inverted in polarity as compared to the unwanted portion of the test pulse so that when it is combined with the unwanted portion of the test pulse, both signals are cancelled for a net zero current and voltage. The same pulse source or a second pulse source may be used to produce a pulse similar to the one that was sent to the transformer, depending on the particular implementation.

The cancellation signal connection 326 may be a direct probe, contact, or wire connection, such as a galvanic connection. The connection may be an inductive, capacitive or direct connection, depending on the particular implementation. If the transformer is coupled to the trace using a removable connector such as pogo pins, then the cancellation signal contact may be implemented using a similar removable structure. This allows the system to be applied to many different traces on the test board.

The cancellation pulse has the same polarity as the pulse injected into the primary windings. Upon injecting the pulse through the primary windings, a reverse polarity pulse occurs at the secondary windings of the transformer towards the non DUT direction. This is cancelled directly by the cancellation pulse with positive polarity.

The values of each of the components 320, 322, 324 between the pulse source and the NUT connection may be calculated directly and depend on the characteristics of the electrical connection between the injection transformer 306, 308 and the behavior of the device or DUT 310 into which the pulse is injected. This relationship may be a simple constant K which is the turns ratio between the primary and secondary sides of the transformer (K:1) or additional factors may be considered. The relationship is indicated in FIG. 3 where the resistor 320 represents the DC resistance of the device into which the circuit injects the positive pulse, and the inductor 322 represents the inductance of the portion of the trace 316 connecting the injection transformer 306, 308 to the DUT.

The diode 324 is used to provide some isolation between the NUT and injection circuit. This is so that the NUT is not significantly altered inside the normal working voltage by the addition of the compensation or pulse cancellation circuit. For many ESD tests, the DUT is in normal or a stressed operational mode and connected to the system board as well as to other devices. In some cases the other devices are simulated by a test system but the DUT is sending and receiving data or power through the traces 314 of the test board. For maximum flexibility in injected pulse polarity, this device may have symmetric breakdown and conduction characteristics which are greater than the peak signaling voltage (VBR=VF>VDD). Due to the nonlinear behavior of most DUTs, the exact I-V (current voltage) characteristics of this diode will have a small effect on the injected pulse. As a result the primary concern is typically the compensation resistor and inductor values.

The cancellation side of the circuit can be dimensioned to be very effective over a wide range of pulse and load conditions. Using fixed resistor and inductor values current injection ratios of approximately 500:1 (wanted:unwanted) may be obtained.

Figure 4:
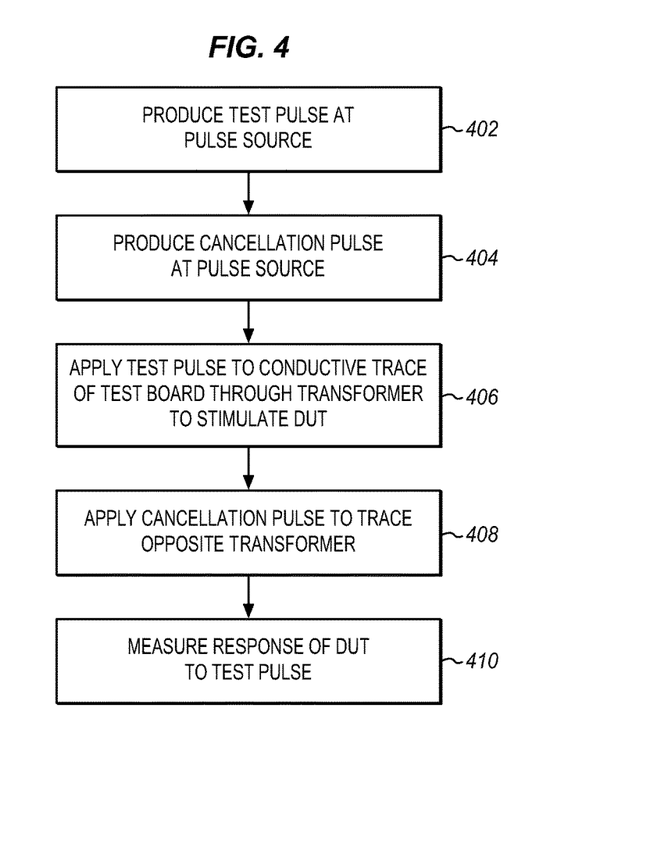
FIG. 4 is a process flow diagram for injecting a test pulse and a cancellation pulse onto a test board according to an embodiment.

FIG. 4 is a process flow diagram of a test process that may be implemented using the system of FIGS. 1, 2, and 3. This process begins with the pulse source which generates a test pulse at 402 and a cancellation pulse at 404. The electrical pulse from the pulse source may be used as both the test pulse and the cancellation pulse or two different pulses may be produced. The pulses may be produced by a single source or by multiple sources. In some embodiments, multiple pulses are applied to a DUT in multiple locations in which case a single test and cancellation pulse may be distributed to multiple locations simultaneously or in rapid succession.

At 406, the test pulse is applied to a conductive trace of a test board through a transformer. The transformer is coupled to the pulse source through a transmission line on a separate board or on the test board. The test board is connected to the DUT so that the trace has a contact that is coupled to the DUT, such as a pad, solder ball, socket land or other connector.

At 408, the cancellation pulse is coupled from a cancellation pulse transmission from the pulse source to a cancellation pulse contact. The cancellation pulse is coupled to the same trace as the transformer but on a side of the trace opposite the transformer. This part of the trace receives the cancellation signal from the pulse source and couples the cancellation signal to the trace to cancel a portion of the test pulse.

At 410, the response of the DUT to the test pulse is measured. This provides result for the test. The DUT is typically being operated during this process. The DUT may be operated in normal or stressed modes to determine the impact of ESD in particular locations of the DUT under different conditions.

Figure 5:
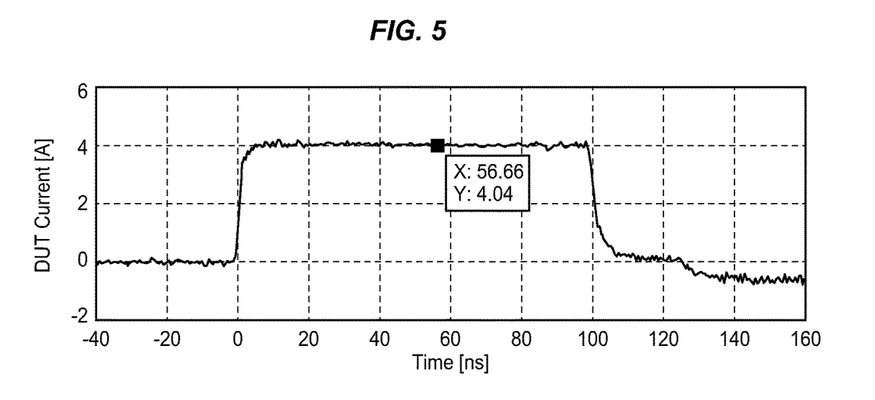
FIG. 5 is a diagram of current over time for a test pulse to a DUT according to an embodiment.
Figure 6:
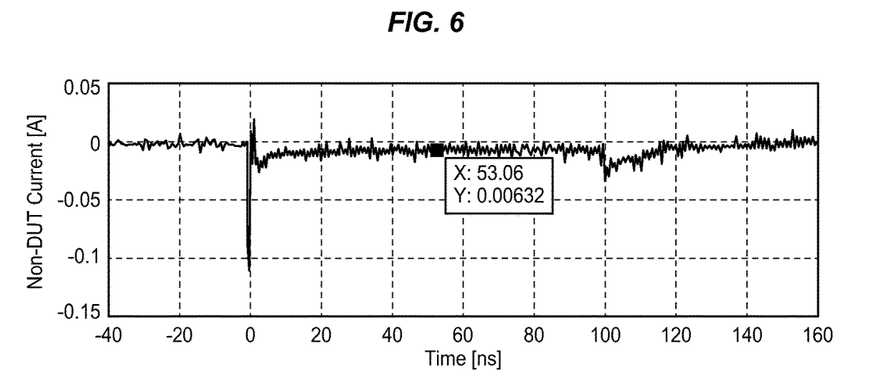
FIG. 6 is a diagram of current over time for the cancelled test pulse to the non-DUT side according to an embodiment.

FIG. 3 shows several signal measurement points that may be used to show the effectiveness of the system. FIG. 5 is a diagram of current applied over time to the DUT connection 310 in one example to simulate an ESD. FIG. 6 is a diagram of the voltage over time for the same pulse at the same location. This location coincides with a monitor 335 on the trace 316 between the injection transformer 306, 308 and the DUT connection 310. The current and voltage of the pulse show very similar behavior with a very steep rise time from zero, a sustained peak for about 100 ns and then a quick falloff back to zero. In this illustration the current is about 4 A and the voltage is about 4V. This is a large stress to typical microelectronic circuit devices.

Figure 7:
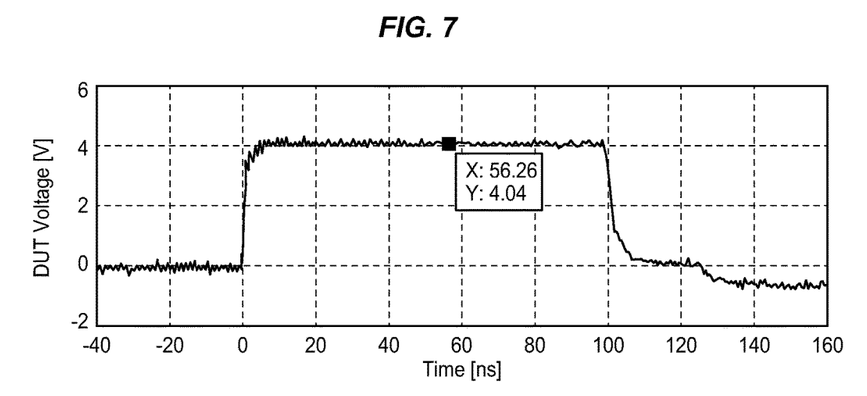
FIG. 7 is a diagram of voltage over time for a test pulse at the DUT according to an embodiment.
Figure 8:
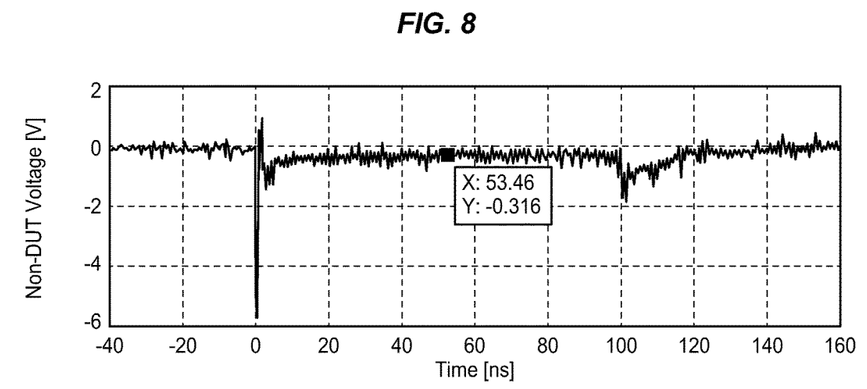
FIG. 8 is a diagram of voltage over time for the same cancelled test pulse at the non-DUT side according to an embodiment.

As shown in FIG. 3, the same pulse will propagate in the opposite direction toward a second unwanted DUT or other connection 312. A monitor 337 may be placed between the non-DUT connection 312 and the injection transformer. The cancellation signal connection 326 is between the injection transformer and the connection. As a result, the pulse from the transformer will be combined with the cancellation signal. The result at the monitor is shown in FIGS. 7 and 8. FIG. 7 shows the current over time at the Non-DUT connection and FIG. 8 shows the voltage over time at the non-DUT connection.

Both FIGS. 7 and 8 show a very similar behavior with a short rise from zero immediately followed by a steep drop or undershoot which quickly level out back to zero. This quick up and down spike and any oscillations are caused by the inherent impedance and capacitance of the system and are on the order of a nanosecond in duration. This duration may be reduced further by adjusting the parameters of the cancellation circuit. The may be reduced to a level that does not significantly impact a typical circuit or microelectronic system. In addition, it can be seen that the initial current fluctuation is on the order of one tenth or less of an amp, rather than multiple amps for the original injected pulse. After the initial pulse, the signal is very close to zero and then at the end of the injected pulse after e.g. 100 ns, it experience a very small negative peak that then levels out quickly after the injected pulse levels out. The fluctuations after the initial pulse are in fractions of an amp and volt and are similar in amplitude to noise that is carried on the traces.

Figure 9:
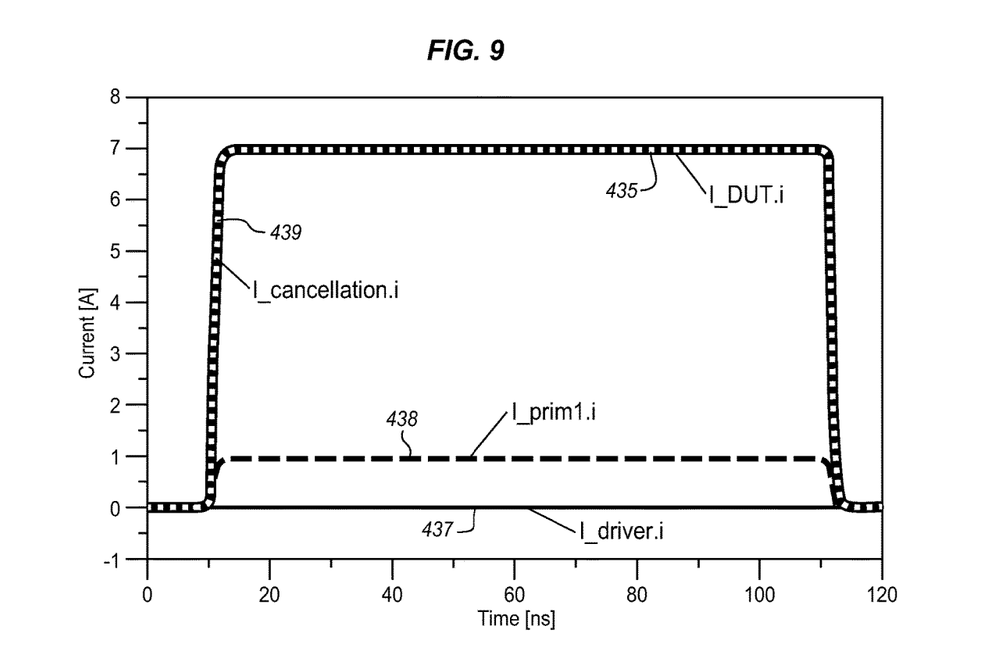
FIG. 9 is a diagram of multiple current amplitudes over time at different locations on the test system of FIG. 3 according to an embodiment.

FIG. 9 presents some of the same signals as current amplitude over time superimposed to show the relationships between them. The primary wanted ESD signal at the DUT connection monitor 335 is shown as the largest amplitude signal 435. The cancellation signal 439 as measured on the cancellation pulse transmission line 342 is the same. This is the signal provided from the pulse source 302 through the RL 320, 322 components to the galvanic connection 326 to the NUT. As a result when these are combined at the galvanic connection 326 the resulting signal 437 at a monitor 337 on the non-DUT connection is essentially flat or zero. FIG. 3 shows a fourth monitor 338 on the test pulse transmission line 340 between the pulse source 301 and the coupling transformer 306, 308. This current is attenuated compared to the eventual ESD pulse through the transformer turns ratio.

While only a single inductive coupling 306, 308 and direct coupling 326 are shown, the system of FIG. 3 may include multiple connections to test different parts of the DUT at the same time or in rapid succession. There may also be multiple test systems applied to different parts of the test board for rapid parallel or serial testing of different parts of the DUT. A fan-out board may allow different traces to be tested at the same time. While the DUT is referred to here as a microelectronic device, such as a die, a chip, a system on a chip, or a system in a package, the system board or motherboard may similarly be tested using a test system such as that shown in FIG. 3.

Figure 10:
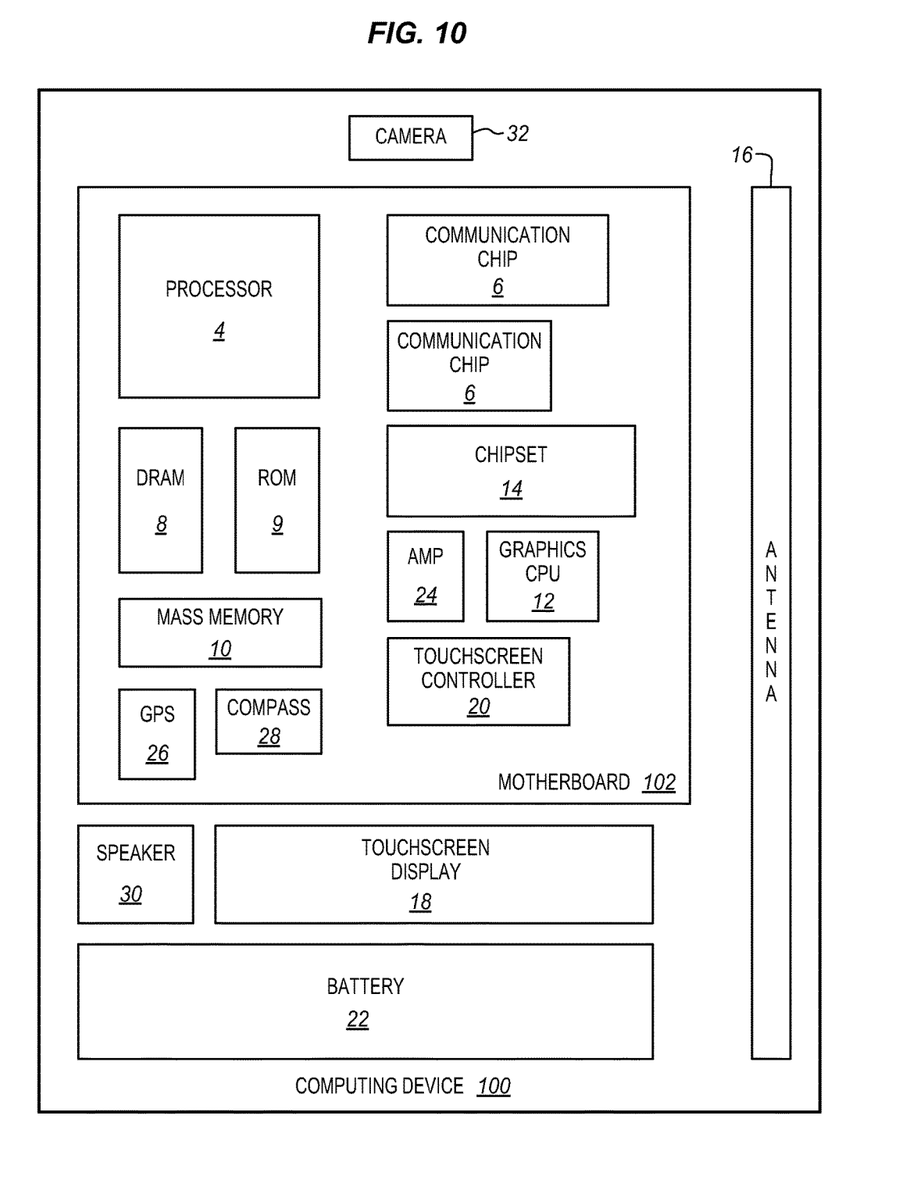
FIG. 10 is a block diagram of a computing device for testing a die or incorporating a tested die according to an embodiment.

FIG. 10 is a block diagram of a computing device 100 in accordance with one implementation of the invention. The computing device may be suitable for use as the test controller 136 and may incorporate microelectronic devices tested for ESD using the techniques and structures described herein. The computing device 100 houses a system board 2.

The board 2 may include a number of components, including but not limited to a processor 4 and at least one communication package 6. The communication package is coupled to one or more antennas 16. The processor 4 is physically and electrically coupled to the board 2. At least one antenna 16 is integrated with a communication package 6 and is physically and electrically coupled to the board 2 through the package. In some implementations of the invention, any one or more of the components, controllers, hubs, or interfaces are formed on dies using through silicon vias as described above.

Depending on its applications, computing device 100 may include other components that may or may not be physically and electrically coupled to the board 2. These other components include, but are not limited to volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

Any one or more of these components may be implemented as packaged semiconductor dies as described herein. Components that are shown here may be combined into a single integrated circuit die or may be combined into a single package. Other components may be implemented as multiple dies in one or more packages. The packages may connect directly to each other or through the system board.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The processor 4 of the computing device 100 includes an integrated circuit die packaged within the processor 4. The term "processor" may refer to any device or portion of a device that processes electronic data from registers and/or memory to transform that electronic data into other electronic data that may be stored in registers and/or memory.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 100 may be a wearable device, such as a watch, glasses, headset or fitness device, a node for the Internet of Things or any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus that includes a pulse source to produce an electrical pulse, a test pulse transmission line coupled to the pulse source, a transformer coupled to the pulse source through the transmission line and to a conductive trace of a test board to apply the electrical pulse to the trace as a test pulse, the test board being connected to a microelectronic device under test, wherein the trace has a contact coupled to the device under test, a cancellation pulse transmission line coupled to the pulse source, and a cancellation pulse contact coupled to the pulse source through the cancellation pulse transmission line and to the trace on a side of the trace opposite the transformer to receive a cancellation signal from the pulse source and to couple the cancellation signal to the trace to cancel a portion of the test pulse.

In some embodiments the pulse source comprises a test pulse source and a cancellation pulse source.

In some embodiments the cancellation pulse transmission line further comprises an inductor selected to match the inductance of the test pulse transmission line and the transformer.

In some embodiments the cancellation pulse transmission line further comprises a resistor selected to match the inductance of the test pulse transmission line and the transformer.

In some embodiments the cancellation pulse transmission line further comprises a diode to decouple the trace from the cancellation pulse transmission line.

In some embodiments wherein the cancellation pulse contact is a galvanic contact.

In some embodiments the transformer has a secondary winding directly connected to the conductive trace of the test board.

Further embodiments include movable pins between the transformer and the trace to allow the transformer to removably contact the trace.

In some embodiments the secondary winding of the transformer consists of a portion of the trace.

Further embodiments include a second board electrically coupled to the test board and having a plurality of contact pads, wherein the transformer is coupled to the conductive trace through contact pads of the second board.

Some embodiments pertain to a method that includes producing an electrical pulse at a pulse source, applying the electrical pulse to a conductive trace of a test board as a test pulse through a transformer coupled to the pulse source through a transmission line, the test board being connected to a microelectronic device under test, wherein the trace has a contact coupled to the device under test, and applying a cancellation pulse from a cancellation pulse transmission line coupled to the pulse source to a cancellation pulse contact, the cancellation pulse contact being coupled to the trace on a side of the trace opposite the transformer to receive the cancellation signal from the pulse source and to couple the cancellation signal to the trace to cancel a portion of the test pulse.

Further embodiments include producing the cancellation pulse at the pulse source.

Further embodiments include impedance matching the test pulse transmission line using an inductor selected to match the inductance of the test pulse transmission line and the transformer.

In some embodiments applying the cancellation pulse comprises applying the cancellation pulse through a galvanic contact to the trace.

In some embodiments applying the test pulse comprises applying the test pulse through a secondary winding of the transformer that is directly connected to the conductive trace of the test board.

In some embodiments applying the test pulse comprises applying the test pulse through a secondary winding of the transformer that is a portion of the trace.

Some embodiments pertain to an apparatus that includes a test board connected to a device under test having a plurality of conductive traces coupled to pins of the device under test, a test controller coupled to the test board to drive the signals and power on the test board to simulate operation of the device under test, a pulse source to produce an electrical pulse, a test pulse transmission line coupled to the pulse source, a transformer coupled to the pulse source through the transmission line and to a selected conductive trace of the plurality of the conductive traces of the test board to apply the electrical pulse to the trace as a test pulse, a cancellation pulse transmission line coupled to the pulse source, and a cancellation pulse contact coupled to the pulse source through the cancellation pulse transmission line and to the selected trace on a side of the selected trace opposite the transformer to receive a cancellation signal from the pulse source and to couple the cancellation signal to the trace to cancel a portion of the test pulse.

In some embodiments the cancellation pulse transmission line includes an inductor selected to match the inductance of the test pulse transmission line and the transformer, a resistor selected to match the inductance of the test pulse transmission line and the transformer, and a diode to decouple the trace from the cancellation pulse transmission line.

In some embodiments the transformer has a secondary winding directly connected to the conductive trace of the test board.

Further embodiments include a second board electrically coupled to the test board and having a plurality of contact pads, wherein the transformer is coupled to the selected conductive trace through contact pads of the second board.

What is claimed is:

1. An apparatus comprising:
   a pulse source to produce an electrical pulse;
   a test pulse transmission line coupled to the pulse source;
   a transformer coupled to the pulse source through the transmission line and to a conductive trace of a test board to apply the electrical pulse to the trace as a test pulse, the test board being connected to a microelectronic device under test, wherein the trace has a contact coupled to the device under test;
   a cancellation pulse transmission line coupled to the pulse source; and
   a cancellation pulse contact coupled to the pulse source through the cancellation pulse transmission line and to the trace on a side of the trace opposite the transformer to receive a cancellation signal from the pulse source and to couple the cancellation signal to the trace to cancel a portion of the test pulse.

2. The apparatus of claim 1, wherein the pulse source comprises a test pulse source and a cancellation pulse source.

3. The apparatus of claim 1, wherein the cancellation pulse transmission line further comprises an inductor selected to match the inductance of the test pulse transmission line and the transformer.

4. The apparatus of claim 1, wherein the cancellation pulse transmission line further comprises a resistor selected to match the inductance of the test pulse transmission line and the transformer.

5. The apparatus of claim 1, wherein the cancellation pulse transmission line further comprises a diode to decouple the trace from the cancellation pulse transmission line.

6. The apparatus of claim 1, wherein the cancellation pulse contact is a galvanic contact.

7. The apparatus of claim 1, wherein the transformer has a secondary winding directly connected to the conductive trace of the test board.

8. The apparatus of claim 1, further comprising movable pins between the transformer and the trace to allow the transformer to removably contact the trace.

9. The apparatus of claim 1, wherein the secondary winding of the transformer consists of a portion of the trace.

10. The apparatus of claim 1, further comprising a second board electrically coupled to the test board and having a plurality of contact pads, wherein the transformer is coupled to the conductive trace through contact pads of the second board.

11. A method comprising:
    producing an electrical pulse at a pulse source;
    applying the electrical pulse to a conductive trace of a test board as a test pulse through a transformer coupled to the pulse source through a transmission line, the test board being connected to a microelectronic device under test, wherein the trace has a contact coupled to the device under test; and
    applying a cancellation pulse from a cancellation pulse transmission line coupled to the pulse source to a cancellation pulse contact, the cancellation pulse contact being coupled to the trace on a side of the trace opposite the transformer to receive the cancellation signal from the pulse source and to couple the cancellation signal to the trace to cancel a portion of the test pulse.

12. The method of claim 11, further comprising producing the cancellation pulse at the pulse source.

13. The method of claim 11, further comprising impedance matching the test pulse transmission line using an inductor selected to match the inductance of the test pulse transmission line and the transformer.

14. The method of claim 11, wherein applying the cancellation pulse comprises applying the cancellation pulse through a galvanic contact to the trace.

15. The method of claim 11, wherein applying the test pulse comprises applying the test pulse through a secondary winding of the transformer that is directly connected to the conductive trace of the test board.

16. The method of claim 11, wherein applying the test pulse comprises applying the test pulse through a secondary winding of the transformer that is a portion of the trace.

17. An apparatus comprising:
    a test board connected to a device under test having a plurality of conductive traces coupled to pins of the device under test;
    a test controller coupled to the test board to drive the signals and power on the test board to simulate operation of the device under test;
    a pulse source to produce an electrical pulse;
    a test pulse transmission line coupled to the pulse source;
    a transformer coupled to the pulse source through the transmission line and to a selected conductive trace of the plurality of the conductive traces of the test board to apply the electrical pulse to the trace as a test pulse;
    a cancellation pulse transmission line coupled to the pulse source; and
    a cancellation pulse contact coupled to the pulse source through the cancellation pulse transmission line and to the selected trace on a side of the selected trace opposite the transformer to receive a cancellation signal from the pulse source and to couple the cancellation signal to the trace to cancel a portion of the test pulse.

18. The apparatus of claim 17, wherein the cancellation pulse transmission line further comprises:
    an inductor selected to match the inductance of the test pulse transmission line and the transformer; a resistor selected to match the inductance of the test pulse transmission line and the transformer; and a diode to decouple the trace from the cancellation pulse transmission line.

19. The apparatus of claim 17, wherein the transformer has a secondary winding directly connected to the conductive trace of the test board.

20. The apparatus of claim 17, further comprising a second board electrically coupled to the test board and having a plurality of contact pads, wherein the transformer is coupled to the selected conductive trace through contact pads of the second board.

\* \* \* \* \*